(12) United States Patent
Falster et al.

(10) Patent No.: US 6,180,220 B1
(45) Date of Patent: *Jan. 30, 2001

(54) IDEAL OXYGEN PRECIPITATING SILICON WAFERS AND OXYGEN OUT-DIFFUSION-LESS PROCESS THEREFOR

(75) Inventors: Robert Falster, Milan; Marco Cornara; Daniela Gambaro, both of Galliate; Massimiliano Olmo, Novara, all of (IT)

(73) Assignee: MEMC Electronic Materials, Inc., St. Peters, MO (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/030,110

(22) Filed: Feb. 25, 1998

Related U.S. Application Data

(63) Continuation-in-part of application No. 08/806,436, filed on Feb. 26, 1997, now Pat. No. 5,994,761.

(51) Int. Cl.$^7$ ......................................................... B32B 3/00
(52) U.S. Cl. ........................ 428/312.6; 428/446; 428/450; 117/930; 423/348; 257/611; 257/913
(58) Field of Search ...................................... 428/418, 446, 428/307.3, 448, 312.6, 450; 117/2, 3, 928, 930; 257/610, 611, 612, 913; 438/143, 473

(56) References Cited

U.S. PATENT DOCUMENTS

| | | | |
|---|---|---|---|
| 4,314,595 | 2/1982 | Yamamoto et al. | 148/1.5 |
| 4,376,657 | 3/1983 | Nagasawa et al. | 148/1.5 |

(List continued on next page.)

FOREIGN PATENT DOCUMENTS

| | | |
|---|---|---|
| 4323964 A1 | 1/1994 | (DE) . |
| 0536958 A1 | 4/1993 | (EP) . |
| 0716168 A1 | 6/1996 | (EP) . |
| 3-9078 | 2/1991 | (JP) . |
| 7/321120 | 5/1994 | (JP) . |
| 7/335657 | 6/1994 | (JP) . |
| 8/045944 | 7/1994 | (JP) . |
| 8/045947 | 8/1994 | (JP) . |
| 8-45945 | 2/1996 | (JP) . |
| 8/045945 | 2/1996 | (JP) . |
| 9-199416 | 7/1997 | (JP) . |
| 11-150119 | 6/1999 | (JP) . |
| WO 98/45507 | 10/1998 | (WO) . |

OTHER PUBLICATIONS

F. Shimura "Semiconductor Silicon Crystal Technology" Academic Press, Inc., San Diego, CA (1989) pp. 360–377. (No Month).

(List continued on next page.)

Primary Examiner—Deborah Jones
Assistant Examiner—Stephen Stein
(74) Attorney, Agent, or Firm—Senniger, Powers, Leavitt & Roedel

(57) ABSTRACT

A process for heat-treating a single crystal silicon wafer to influence the precipitation behavior of oxygen in the wafer in a subsequent thermal processing step. The wafer has a front surface, a back surface, and a central plane between the front and back surfaces. In the process, the wafer is subjected to a heat-treatment to form crystal lattice vacancies, the vacancies being formed in the bulk of the silicon. The wafer is then cooled from the temperature of said heat treatment at a rate which allows some, but not all, of the crystal lattice vacancies to diffuse to the front surface to produce a wafer having a vacancy concentration profile in which the peak density is at or near the central plane with the concentration generally decreasing in the direction of the front surface of the wafer.

57 Claims, 10 Drawing Sheets

U.S. PATENT DOCUMENTS

| | | | |
|---|---|---|---|
| 4,437,922 | | 3/1984 | Bischoff et al. ................. 156/603 |
| 4,505,759 | * | 3/1985 | O'Mara ................. 148/1.5 |
| 4,548,654 | | 10/1985 | Tobin ................. 148/1.5 |
| 4,851,358 | | 7/1989 | Huber ................. 437/10 |
| 4,868,133 | | 9/1989 | Huber ................. 437/10 |
| 5,327,007 | | 7/1994 | Imura et al. ................. 257/610 |
| 5,401,669 | | 3/1995 | Falster et al. ................. 437/12 |
| 5,403,406 | | 4/1995 | Falster et al. ................. 148/33.2 |
| 5,445,975 | | 8/1995 | Gardner et al. ................. 437/10 |
| 5,478,408 | * | 12/1995 | Mitani et al. ................. 448/33.3 |
| 5,502,010 | | 3/1996 | Nadahara et al. ................. 437/247 |
| 5,502,331 | | 3/1996 | Inoue et al. ................. 257/617 |
| 5,534,294 | | 7/1996 | Kubota et al. ................. 427/255 |
| 5,539,245 | | 7/1996 | Imura et al. ................. 257/610 |
| 5,548,654 | * | 8/1996 | Tobin ................. 148/1.5 |
| 5,593,494 | * | 1/1997 | Falster ................. 117/2 |
| 5,611,855 | * | 3/1997 | Wijaranakula ................. 117/2 |
| 5,674,756 | | 10/1997 | Satoh et al. ................. 437/10 |
| 5,738,942 | | 4/1998 | Kubota et al. ................. 428/428 |
| 5,788,763 | * | 8/1998 | Hayashi et al. ................. 117/2 |
| 5,954,873 | | 9/1999 | Hourai et al. ................. 117/13 |

OTHER PUBLICATIONS

T. Abe "Innovated Silicon Crystal Growth and Wafering Technologies" Electrochemical Society Proceedings, vol. 97, No. 3, pp. 123–133. (No Month).

Abe et al. "Defect–Free Surfaces of Bulk Wafers by Combination of RTA and Crystal Growth Conditions" (publication information unknown) (No Month/No Year).

Hara et al. "Enhancement of Oxygen Precipitation in Quenched Czochralski Silicon Crystals" Journal of Applied Phys. vol. 66 (1989) pp. 3958–3960 (Oct. 1989).

Winkler et al. "Improvement of the Gate Oxide Integrity by Modifying Crystal Pulling and its Impact on Device Failures" J. Electrochem. Soc., vol. 141, No. 5 (1994) pp. 1398–1401. (May 1994).

Zimmerman et al. "Vacancy Concentration Wafer Mapping in Silicon" J. Crystal Growth, vol. 129 (1993) pp. 582–592. (No Month).

Herng–Der Chiou, "The Effects of Preheatings on Axial Oxygen Precipitation Uniformity in Czochralski Silicon Crystals", J. Electrochem. Soc., vol. 139, No. 6, Jun. 1992.

Falster, R., et al., "The Engineering of Silicon Wafer Material Properties Through Vacancy Concentration Profile Control and the Achievement of Ideal Oxygen Precipitation Behavior", Mat. Res. Soc. Symp. Proc. vol. 510, pp. 27–35, 1998 (No Month).

Jacob, M., et al. "Influence of RTP on Vacancy Concentrations", Mat. Res. Soc. Symp. Proc. vol. 490, pp. 129–134, 1998. (No Month).

Pagani, M., et al. "Spatial variations on oxygen precipitation in silicon after high temperature rapid thermal annealing", Appl. Physl. Lett., vol. 70, No. 12, pp. 1572–1574, 1997. (Mar. 1997).

* cited by examiner

IDEAL OXYGEN PRECIPITATING SILICON WAFERS AND OXYGEN OUT-DIFFUSION-LESS PROCESS THEREFOR

REFERENCE TO RELATED APPLICATION

This application is a continuation-in-part application based on U.S. Ser. No. 08/806,436, filed Feb. 26, 1997 now U.S. Pat. No. 5,994,761.

BACKGROUND OF THE INVENTION

The present invention generally relates to the preparation of semiconductor material substrates, especially silicon wafers, which are used in the manufacture of electronic components. More particularly, the present invention relates to a process for the treatment of silicon wafers which enables the wafers, during the heat treatment cycles of essentially any arbitrary electronic device manufacturing process to form an ideal, non-uniform depth distribution of oxygen precipitates.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes included a series of steps which were designed to produce silicon having a zone or region near the surface of the wafer which is free of oxygen precipitates (commonly referred to as a "denuded zone" or a "precipitate free zone") with the balance of the wafer, i.e., the wafer bulk, containing a sufficient number of oxygen precipitates for IG purposes. Denuded zones can be formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600–750° C.), and (c) growth of oxygen ($SiO_2$) precipitates at a high temperature (1000–1150° C.). See, e.g., F. Shimura, *Semiconductor Silicon Crystal Technology*, Academic Press, Inc., San Diego Calif. (1989) at pages 361–367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

SUMMARY OF THE INVENTION

Among the objects of the invention, therefore, is the provision of a single crystal silicon wafer which, during the heat treatment cycles of essentially any electronic device manufacturing process, will form an ideal, non-uniform depth distribution of oxygen precipitates; the provision of such a wafer which will optimally and reproducibly form a denuded zone of sufficient depth and a sufficient density of oxygen precipitates in the wafer bulk; the provision of such a wafer in which the formation of the denuded zone and the formation of the oxygen precipitates in the wafer bulk is not dependant upon differences in oxygen concentration in these regions of the wafer; the provision of such a process in which the formation of the denuded zone does not depend upon the out-diffusion of oxygen; the provision of such a wafer in which the thickness of the resulting denuded zone is essentially independent of the details of the IC manufacturing process sequence; and the provision of such a wafer in which the formation of the denuded zone and the formation of the oxygen precipitates in the wafer bulk is not influenced by the thermal history and the oxygen concentration of the Czochralski-grown, single crystal silicon ingot from which the silicon wafer is sliced.

Briefly, therefore, the present invention is directed to a single crystal silicon wafer having two major, generally parallel surfaces, one of which is the front surface of the wafer and the other of which is the back surface of the wafer, a central plane between the front and back surfaces, a circumferential edge joining the front and back surfaces, a surface layer which comprises the region of the wafer between the front surface and a distance, $D_1$, of at least about 10 micrometers measured from the front surface and toward the central plane, and a bulk layer which comprises a second region of the wafer between the central plane and the first region. In particular, the wafer has a non-uniform distribution of crystal lattice vacancies with the concentration of vacancies in the bulk layer being greater than the concentration of vacancies in the surface layer and with the vacancies having a concentration profile in which the peak density of the vacancies is at or near the central plane, the concentration generally decreasing from the position of peak density in the direction of the front surface of the wafer.

The present invention is further directed to a single crystal silicon wafer comprising two major, generally parallel surfaces, one of which is the front surface of the wafer and the other of which is the back surface of the wafer, a central plane between the front and back surfaces, and a circumferential edge joining the front and back surfaces, a front surface layer consisting of the region of the wafer within a distance, $D_2$, of no more than about 15 micrometers of the front surface and a bulk layer comprising the region of the wafer between the central plane and the front surface layer. In particular, the bulk layer has a substantially uniform oxygen concentration and a concentration of crystal lattice vacancies such that, upon subjecting the wafer to an oxygen precipitation heat treatment consisting essentially of annealing the wafer at 800° C. for four hours and then at 1000° C. for sixteen hours, the wafer will contain oxygen precipitates having a concentration profile in which the peak density of the precipitates in the bulk layer is at or near the central plane with the concentration of the precipitates in the bulk layer generally decreasing in the direction of the front surface layer.

The present invention is further directed to a single crystal silicon wafer having two major, generally parallel surfaces, one of which is the front surface of the wafer and the other of which is the back surface of the wafer, a central plane between the front and back surfaces, and a circumferential edge joining the front and back surfaces. The wafer is characterized in that it comprises a denuded zone which contains interstitial oxygen and which comprises the region of the wafer from the front surface to a distance, $D_1$, of at least about 10 micrometers measured from the front surface and toward the central plane. The wafer is characterized in that the concentration of interstitial oxygen in the denuded zone at a distance equal to one-half of $D_1$, is at least about 75% of the maximum concentration of interstitial oxygen in the denuded zone.

The present invention is further directed to a process for heat-treating a single crystal silicon wafer to influence the precipitation behavior of oxygen in the wafer in a subsequent thermal processing step, the silicon wafer having a front surface, a back surface, a central plane between the front and back surfaces, a surface layer which comprises the region of the wafer between the front surface and a distance, D, measured from the front surface and toward the central plane, and a bulk layer which comprises the region of the wafer between the central plane and surface layer. The process comprises the steps of heat-treating the wafer in a non-nitriding atmosphere to form crystal lattice vacancies in the surface and bulk layers, and controlling the cooling rate of the heat-treated wafer to produce a wafer having a vacancy concentration profile in which the peak density is at or near the central plane, with the concentration generally decreasing in the direction of the front surface of the wafer, and the difference in the concentration of vacancies in the surface and bulk layers being such that a thermal treatment of the wafer at a temperature in excess of 750° C. is capable of forming a denuded zone in the surface layer and oxygen clusters or precipitates in the bulk layer, with the concentration of the oxygen clusters or precipitates in the bulk layer being primarily dependant upon the concentration of vacancies.

The present invention is further directed to a process for heat-treating a single crystal silicon wafer sliced from a single crystal silicon ingot grown by the Czochralski method to influence the precipitation behavior of oxygen in the wafer in a subsequent thermal processing step. The silicon wafer has a front surface, a back surface, a central plane between the front and back surfaces, a surface layer which comprises the region of the wafer between the front surface and a distance, D, measured from the front surface and toward the central plane, and a bulk layer which comprises the region of the wafer between the central plane and surface layer. The process comprises the steps of: (i) growing an oxide layer on the front surface of the wafer by heating the wafer in the presence of an oxygen containing ambient, (ii) heat-treating the oxidized wafer at a temperature of at least about 1175° C. to form crystal lattice vacancies in the surface and bulk layers, (iii) cooling the wafer to a temperature of less than 900° C., and (iv) controlling the cooling rate of the heat-treated wafer between the heat-treating temperature and 900° C. to produce a wafer having a vacancy concentration profile in which the peak density is at or near the central plane with the concentration generally decreasing in the direction of the front surface of the wafer and the difference in the concentration of vacancies in the surface and bulk layers being such that a thermal treatment of the wafer at a temperature in excess of 750° C. is capable of forming a denuded zone in the surface layer and oxygen clusters or precipitates in the bulk layer with the concentration of the oxygen clusters or precipitates in the bulk layer being primarily dependant upon the concentration of vacancies.

The present invention is further directed to a process for heat-treating a single crystal silicon wafer sliced from a single crystal silicon ingot grown by the Czochralski method to influence the precipitation behavior of oxygen in the wafer in a subsequent thermal processing step. The silicon wafer has a front surface, a back surface, a central plane between the front and back surfaces, a surface layer which comprises the region of the wafer between the front surface and a distance, D, measured from the front surface and toward the central plane, and a bulk layer which comprises the region of the wafer between the central plane and surface layer. The process comprises steps of (i) heat-treating the wafer in an oxygen containing atmosphere to form crystal lattice vacancies in the surface and bulk layers, and (ii) controlling the cooling rate of the heat-treated wafer to produce a wafer having a vacancy concentration profile in which the peak density is at or near the central plane with the concentration generally decreasing in the direction of the front surface of the wafer and the difference in the concentration of vacancies in the surface and bulk layers being such that a thermal treatment of the wafer at a temperature in excess of 750° C. is capable of forming a denuded zone in the surface layer and oxygen clusters or precipitates in the bulk layer with the concentration of the oxygen clusters or precipitates in the bulk layer being primarily dependant upon the concentration of vacancies.

Other objects and features of this invention will be in part apparent and in part pointed out hereinafter.

DETAILED DESCRIPTION OF THE PREFERRED EMBODIMENTS

Figure 1:
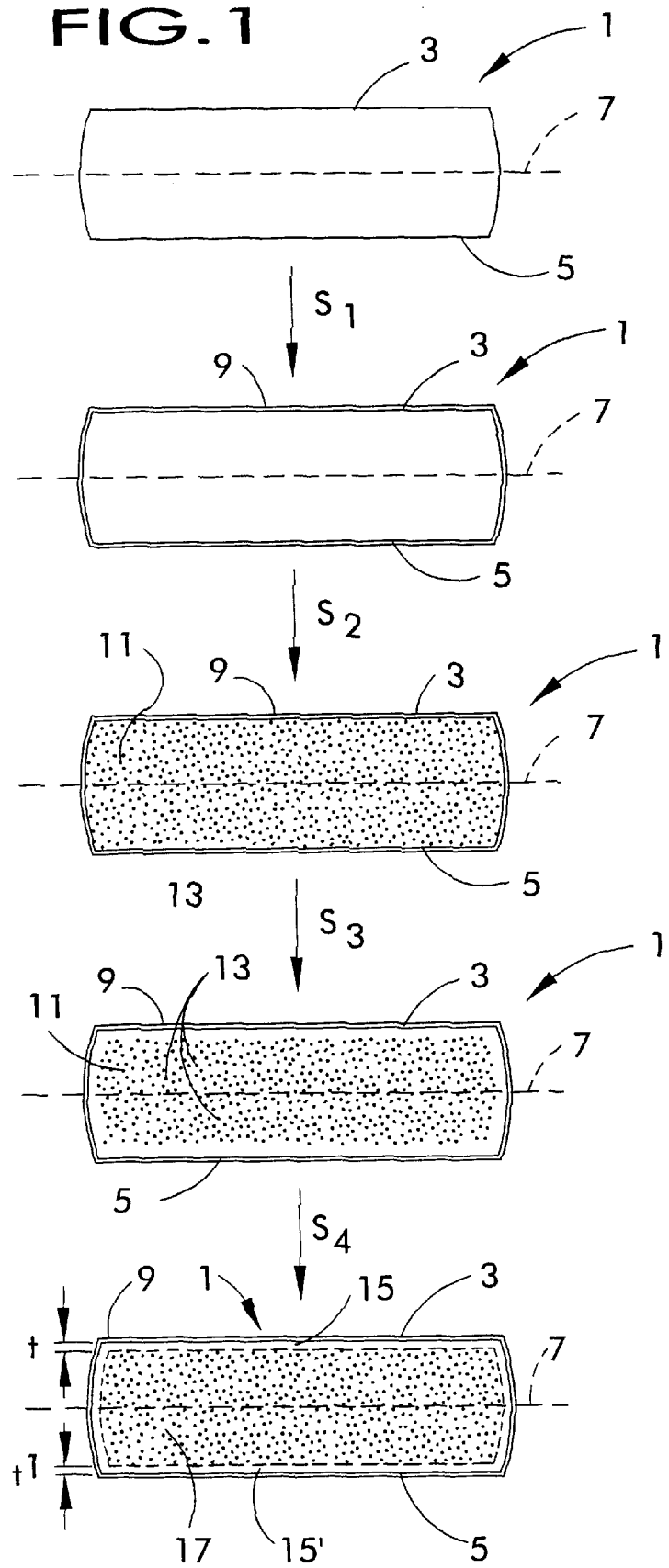
FIG. 1 is a schematic depiction of the process of the present invention.

In accordance with the present invention, an ideal precipitating wafer has been discovered which, during essentially any electronic device manufacturing process, will form a denuded zone of sufficient depth and a wafer bulk containing a sufficient density of oxygen precipitates for IG purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will precipitate during the electronic device manufacturing process.

The starting material for the ideal precipitating wafer of the present invention is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference).

Czochralski-grown silicon typically has an oxygen concentration within the range of about $5 \times 10^{17}$ to about $9 \times 10^{17}$ atoms/cm$^3$ (ASTM standard F-121-83). Because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process.

Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced. The presence or absence of these nucleation centers in the starting material is not critical to the present invention provided, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C. The detection limit for oxygen precipitates is currently about $5 \times 10^6$ precipitates/cm$^3$. The presence (or density) of oxygen precipitation nucleation centers cannot be directly measured using presently available techniques. Various techniques may be used, however, to indirectly detect their presence. As previously discussed, preexisting oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment, e.g., annealing the wafer at a temperature of 800° C. for four hours and then at a temperature of 1000° C. for sixteen hours.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Referring now to FIG. 1, the starting material for the ideal precipitating wafer of the present invention, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In a first embodiment of the process of the present invention wafer 1 is heat-treated in an oxygen-containing atmosphere in step S$_1$, to grow a superficial oxide layer 9 which envelopes wafer 1. In general, the oxide layer will have a thickness which is greater than the native oxide layer which forms upon silicon (about 15 Ångstroms); preferably, the oxide layer has a thickness of at least about 20 Ångstroms and, in some embodiments, at least about 25 Ångstroms or even at least about 30 Ångstroms. Experimental evidence obtained to-date, however, suggests that oxide layers having a thickness greater than about 30 Ångstroms, while not interfering with the desired effect, provide little or no additional benefit.

In step S$_2$, the wafer is subjected to a heat-treatment step in which the wafers are heated to an elevated temperature to form and thereby increase the number density of crystal lattice vacancies 13 in wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

In the first embodiment of the present invention, the rapid thermal annealing step is carried out in the presence of a nitriding atmosphere, that is, an atmosphere containing nitrogen gas (N$_2$) or a nitrogen-containing compound gas such as ammonia which is capable of nitriding an exposed silicon surface. The atmosphere may thus consist entirely of nitrogen or nitrogen compound gas, or it may additionally comprise a non-nitriding gas such as argon. An increase in vacancy concentration throughout the wafer is achieved nearly, if not immediately, upon achieving the annealing temperature. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). The resulting wafer will have a relatively uniform vacancy concentration (number density) profile in the wafer.

Based upon experimental evidence obtained to-date, the atmosphere in which the rapid thermal annealing step is carried out preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced, or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step whereas they are essentially immobile for any commercially practical time period at temperatures of as much as 700° C. . Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the wafer is decreased through this range of temperatures, the vacancies diffuse to the oxide layer 9 and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout wafer bulk 11 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near central plane 7 and the vacancy concentration decreasing in the direction of the front surface 3 and back surface 5 of the wafer. In general, the average cooling rate within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

In step $S_4$, the wafer is subjected to an oxygen precipitation heat-treatment. For example, the wafer may be annealed at a temperature of 800° C. for four hours and then at a temperature of 1000° C. for sixteen hours. Alternatively and preferably, the wafer is loaded into a furnace which is at a temperature of about 800° C. as the first step of an electronic device manufacturing process. When loaded into a furnace at this temperature, the previously rapidly thermal annealed wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed, whereas in the vacancy lean zone nothing happens. By dividing the wafer into various zones of vacancy concentration, a template is effectively created through which is written an oxygen precipitate pattern which is fixed the moment the wafer is loaded into the furnace.

As illustrated in FIG. 1, the resulting depth distribution of oxygen precipitates in the wafer is characterized by clear regions of oxygen precipitate-free material (denuded zones) 15 and 15' extending from the front surface 3 and back surface 5 to a depth t, t', respectively. Between the oxygen precipitate-free regions, 15 and 15', there is a region 17 which contains a substantially uniform density of oxygen precipitates.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with denuded zone depths of at least about 10, 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced.

While the rapid thermal treatments employed in this process of the present invention may result in the out-diffusion of a small amount of oxygen from the surface of the front and back surfaces of the wafer, the amount of out-diffusion is significantly less than what is observed in conventional processes for the formation of denuded zones. As a result, the ideal precipitating wafers of the present invention have a substantially uniform interstitial oxygen concentration as a function of distance from the silicon surface. For example, prior to the oxygen precipitation heat-treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat-treatments do not result in a substantial amount of oxygen outdiffusion from the heat-treated wafer. As a result, the concentration of interstitial oxygen in the denuded zone at distances more than several microns from the wafer surface will not significantly change as a consequence of the precipitation heat-treatment. For example, if the denuded zone of the wafer consists of the region of the wafer between the surface of the silicon and a distance, $D_1$, (which is at least about 10 micrometers) as measured from the front surface and toward the central plane, the oxygen concentration at a position within the denuded zone which is at a distance from the silicon surface equal to one-half of $D_1$ will typically be at least about 75% of the peak concentration of the interstitial oxygen concentration anywhere in the denuded zone. For some oxygen precipitation heat-treatments, the interstitial oxygen concentration at this position will be even greater, i.e., at least 85%, 90% or even 95% of the maximum oxygen concentration anywhere in the denuded zone.

In a second embodiment of the present invention, a non-nitriding atmosphere is used instead of the nitriding atmosphere used in the heating (rapid thermal annealing) and cooling steps of the first embodiment. Suitable non-nitriding atmospheres include argon, helium, neon, carbon dioxide, and other such non-oxidizing, non-nitriding elemental and compound gases, or mixtures of such gases. The non-nitriding atmosphere, like the nitriding atmosphere, may contain a relatively small partial pressure of oxygen, i.e., a partial pressure less than 0.01 atm. (10,000 ppma), more preferably less than 0.005 atm. (5,000 ppma), more preferably less than 0.002 atm. (2,000 ppma), and most preferably less than 0.001 atm. (1,000 ppma).

In a third embodiment of the present invention, step $S_1$ (the thermal oxidation step) is omitted and the starting wafer has no more than a native oxide layer. When such a wafer is annealed in a nitrogen atmosphere, however, the effect differs from that which is observed when a wafer having an oxide layer which is greater in thickness than a native oxide layer ("enhanced oxide layer") is annealed in nitrogen. When the wafer containing an enhanced oxide layer is annealed in a nitrogen atmosphere, a substantially uniform increase in the vacancy concentration is achieved throughout the wafer nearly, if not immediately, upon reaching the annealing temperature; furthermore, the vacancy concentration does not appear to significantly increase as a function of annealing time at a given annealing temperature. If the wafer lacks anything more than a native oxide layer and if the front and back surfaces of the wafer are annealed in nitrogen, however, the resulting wafer will have a vacancy concentration (number density) profile which is generally "U-shaped" for a cross-section of the wafer; that is, a maximum concentration will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer.

Experimental evidence further suggests that this difference in behavior for wafers having no more than a native oxide layer and wafers having an enhanced oxide layer can be avoided by including molecular oxygen or another oxidizing gas in the atmosphere. Stated another way, when wafers having no more than a native oxide are annealed in a nitrogen atmosphere containing a small partial pressure of oxygen, the wafer behaves the same as wafers having an enhanced oxide layer. Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step.

In accordance with the present invention, therefore, the atmosphere during the rapid thermal annealing step preferably contains a partial pressure of at least about 0.0001 atm. (100 ppma), more preferably a partial pressure of at least about 0.0002 atm. (200 ppma). For the reasons previously discussed, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

In other embodiments of the present invention, the front and back surfaces of the wafer may be exposed to different atmospheres, each of which may contain one or more nitriding or non-nitriding gases. For example, the back surface of the wafer may be exposed to a nitriding atmosphere as the front surface is exposed to a non-nitriding atmosphere. Alternatively, multiple wafers (e.g., 2, 3 or more wafers) may be simultaneously annealed while being stacked in face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon the side of the wafer at which the denuded zone is desired, e.g., front surface 3 of the wafer (see FIG. 1).

The starting material for the process of the present invention may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material.

If an epitaxial layer is to be deposited upon an ideal precipitating wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example; by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

Examples 1 through 4 illustrate the ideal oxygen precipitation process of the present invention. These Examples should therefore not be interpreted in a limiting sense.

EXAMPLE 1

Silicon single crystals were pulled by the Czochralski method, sliced and polished to form silicon wafers. These wafers were then subjected to a surface oxidation step ($S_1$), rapid thermal annealing step in nitrogen or argon ($S_2$), rapidly cooled ($S_3$), and subjected to an oxygen stabilization and growth step ($S_4$) under the conditions set forth in Table I. The initial oxygen concentration of the wafers ($O_i$) before steps $S_1$–$S_4$, the oxygen precipitate density in the bulk of the wafers after step $S_4$ (OPD), and the depth of the denuded zone after step $S_4$ (DZ) are also reported in Table I.

TABLE I

| Sample | 4–7 | 4–8 | 3–14 |
|---|---|---|---|
| $S_1$ | 15 min at 1,000° C. in $N_2$ + ~1% $O_2$ | 15 min at 1,000° C. in $N_2$ + ~1% $O_2$ | none |
| $S_2$ | 35 seconds at 1250° C. in $N_2$ | 35 seconds at 1250° C. in Ar | 35 seconds at 1250° C. in $N_2$ |
| $S_3$ | 100° C./sec 4 hr at | 100° C./sec 4 hr at | 100° C./sec 4 hr at |
| $S_4$ | 800° C. + 16 hr at 1,000° C. in $N_2$ | 800° C. + 16 hr at 1,000° C. in $N_2$ | 800° C. + 16 hr at 1,000° C. in $N_2$ |
| $O_i$ (atoms/cm$^3$) | $7 \times 10^{17}$ | $6.67 \times 10^{17}$ | $7.2 \times 10^{17}$ |
| OPD (atoms/cm$^3$) | $1 \times 10^{10}$ | $4.4 \times 10^9$ | $1.69 \times 10^{10}$ |
| DZ (depth in μm) | 70 | 95 | 0 |

Figure 2:
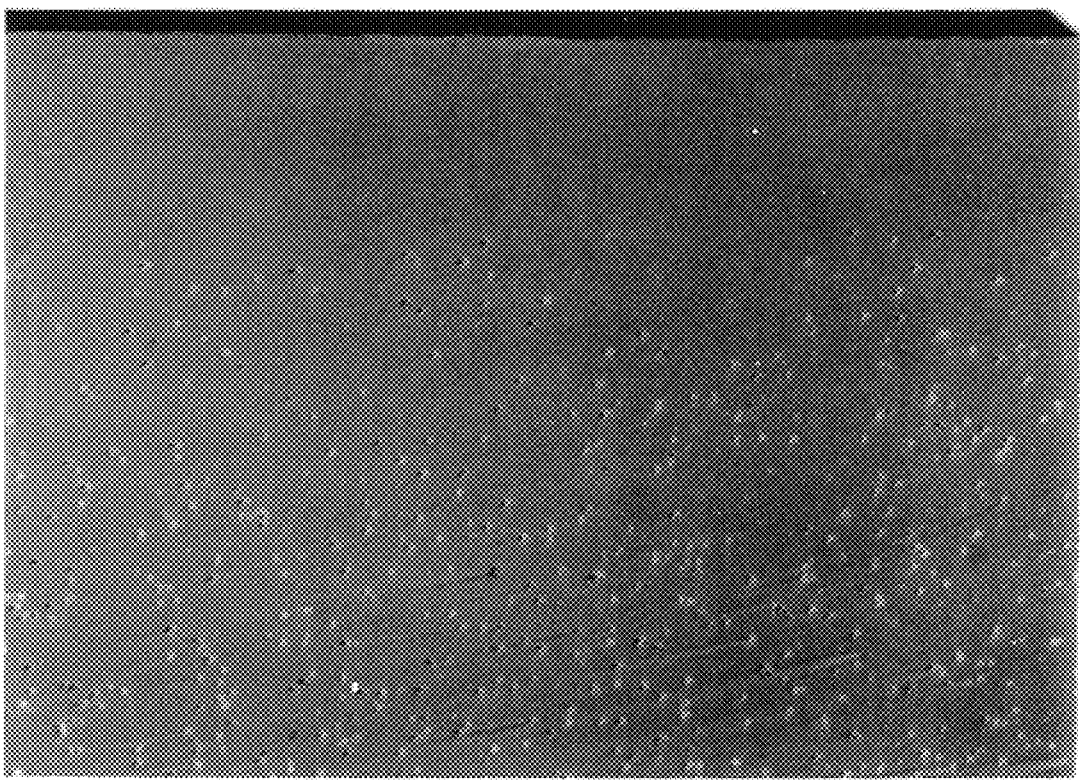
FIG. 2 is a photograph of a cross-section of a wafer (sample 4–7) which was processed as described in Example 1.
Figure 3:
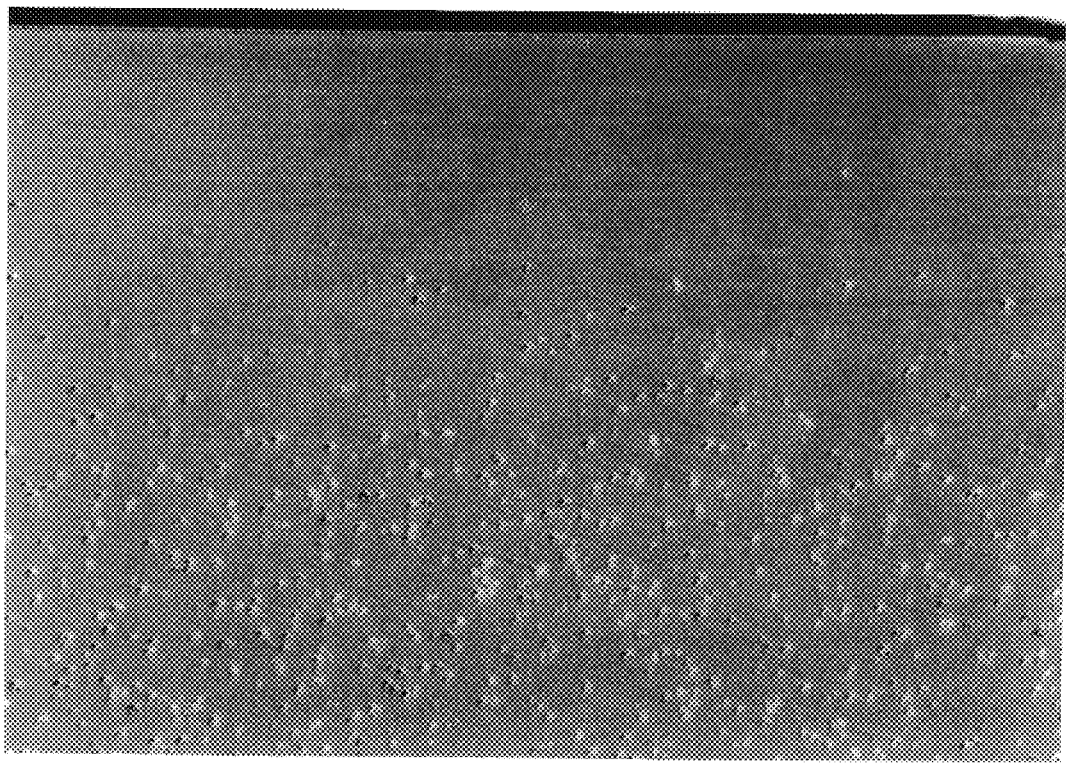
FIG. 3 is a photograph of a cross-section of a wafer (sample 4–8) which was subjected to the series of steps described in Example 1.
Figure 4:
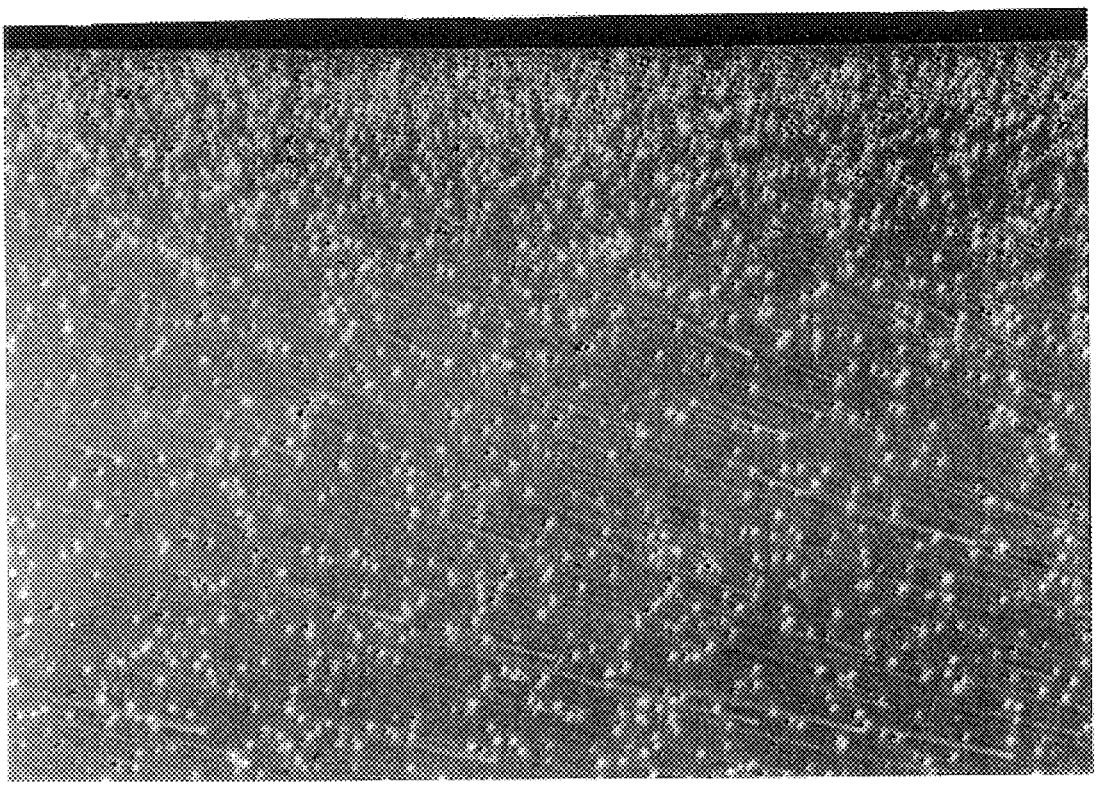
FIG. 4 is a photograph of a cross-section of a wafer (sample 3–14) which was subjected to the series of steps described in Example 1.

FIGS. 2, 3, and 4 show cross-sections of the resulting wafers (these figures are enlargements of photographs taken at a magnification of 200×); sample 4–7 is shown in FIG. 2, sample 4–8 is shown in FIG. 3, and sample 3–14 is shown in FIG. 4.

Figure 5:
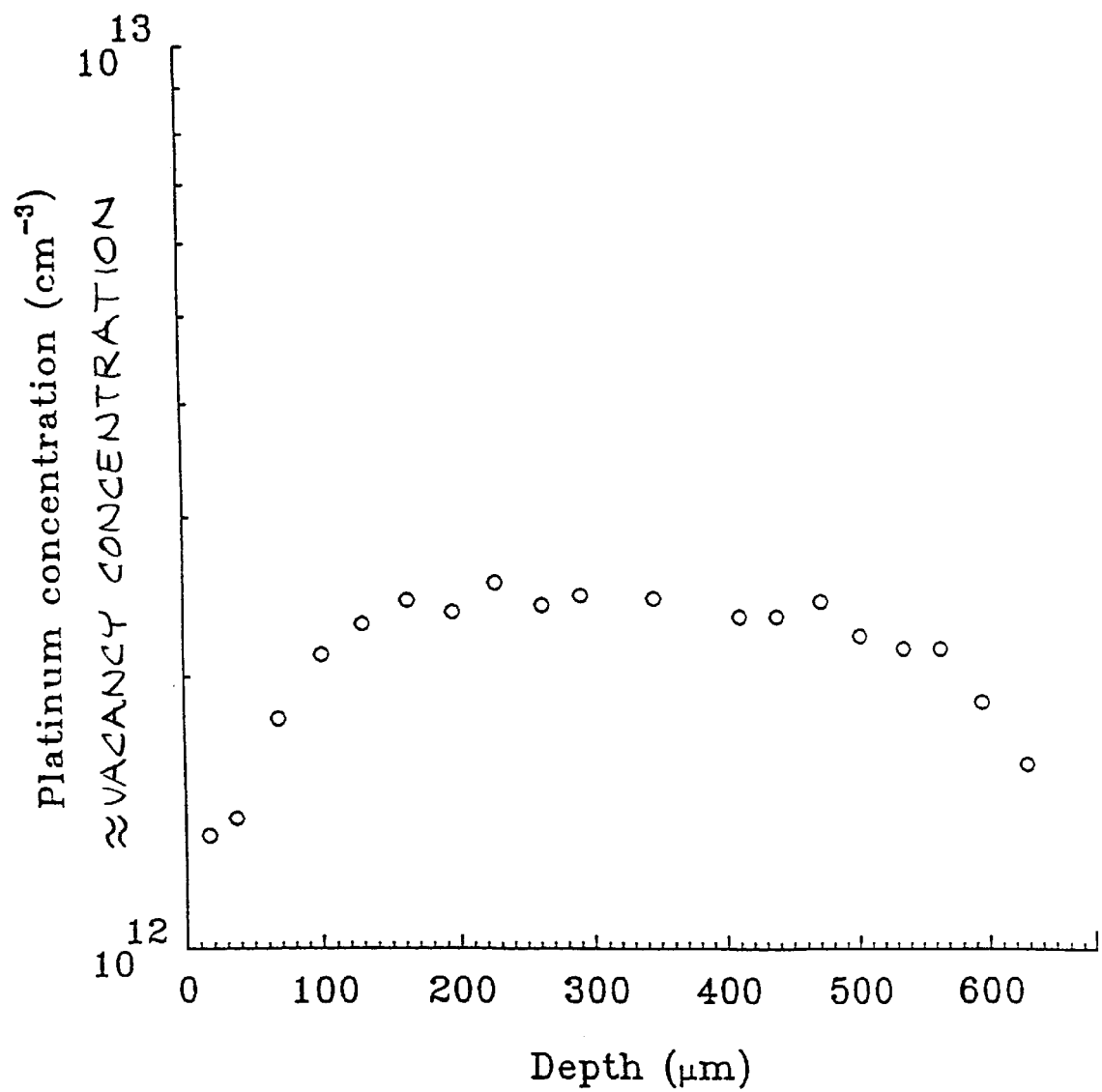
FIG. 5 is a graph of the log of platinum concentration (atoms/cm$^3$) versus depth from the surface of a wafer (sample 4–7) which was subjected to the series of steps set forth in Example 1.

In addition, the concentration of crystal lattice vacancies in the sample 4–7 was mapped using a platinum diffusion technique. A plot of platinum concentration versus depth from the surface of the wafer (a depth of 0 micrometers corresponding to the front side of the wafer) appears in FIG. 5.

EXAMPLE 2

Figure 6:
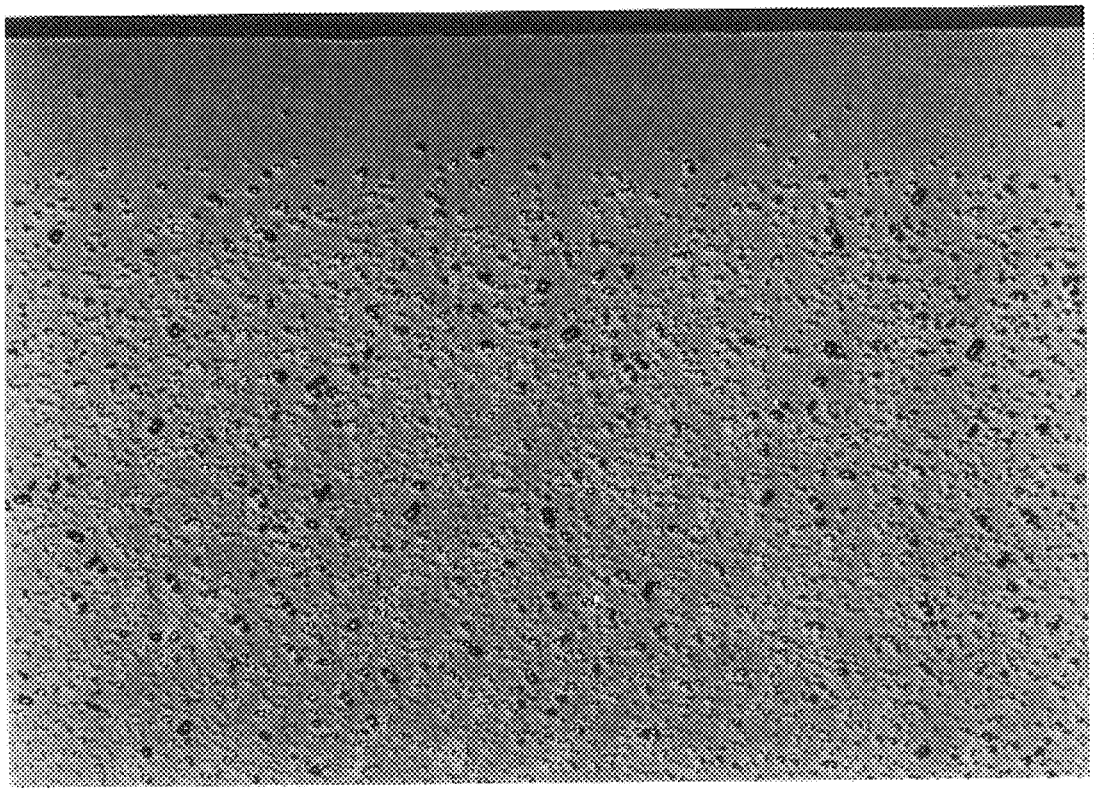
FIG. 6 is a photograph of a cross-section of a wafer (sample 3–4) which was subjected to the series of steps set forth in Example 2.
Figure 7:
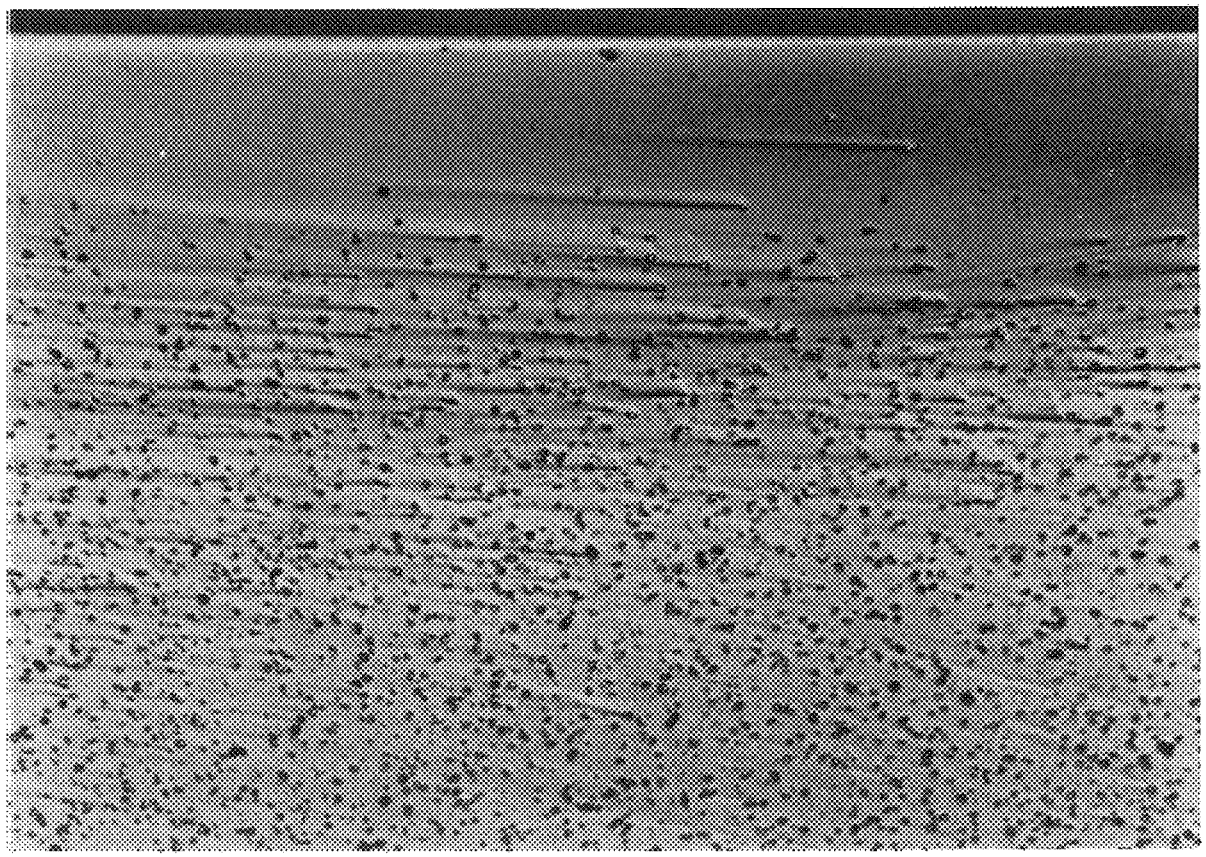
FIG. 7 is a photograph of a cross-section of a wafer (sample 3–5) which was subjected to the series of steps set forth in Example 2.
Figure 8:
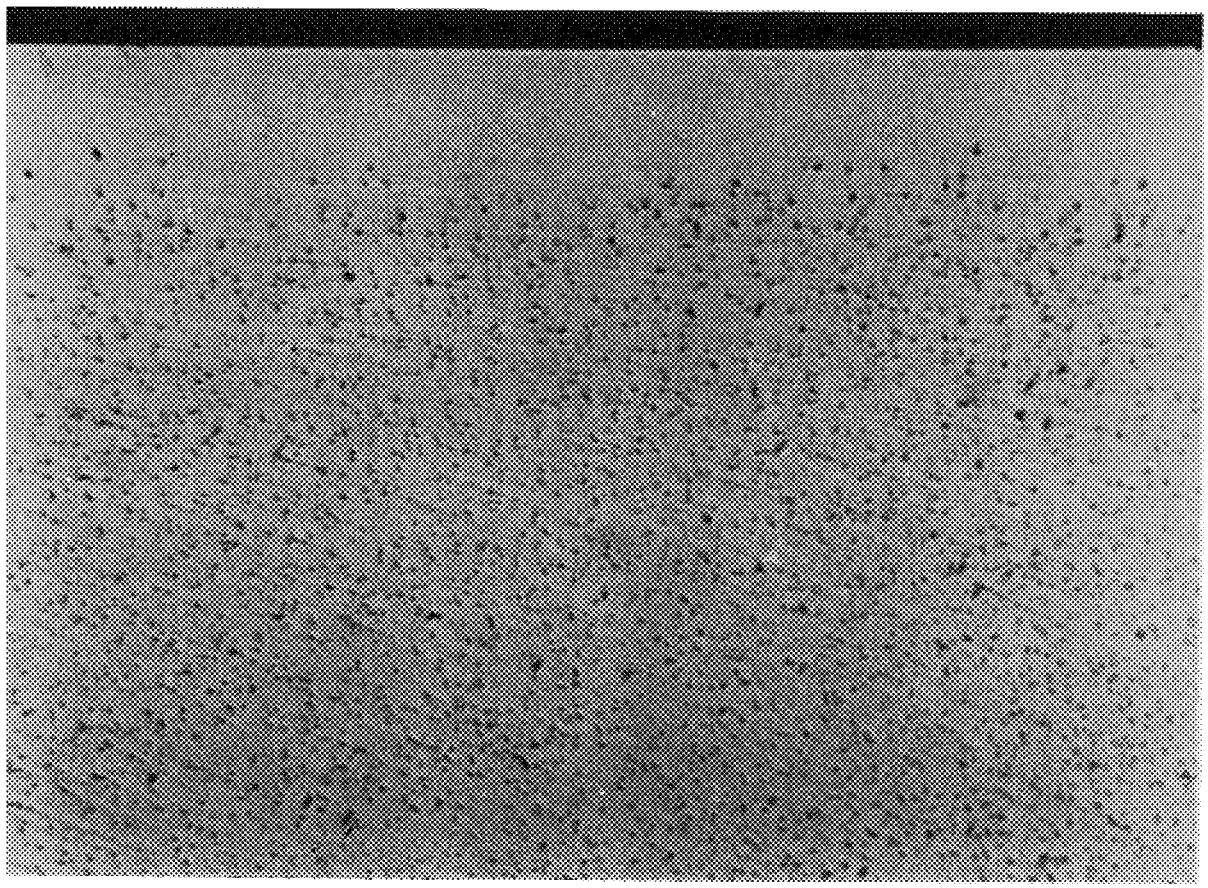
FIG. 8 is a photograph of a cross-section of a wafer (sample 3–6) which was subjected to the series of steps set forth in Example 2.

To demonstrate that the process of the present invention is relatively independent of oxygen concentration for Czochralski-grown silicon wafers, three wafers having different oxygen concentrations were subjected to the same series of steps described in Example 1. The conditions for each of these steps, the initial oxygen concentration of the wafers ($O_i$) before steps $S_1$–$S_4$, the oxygen precipitate density (OPD) in the bulk of the wafers after step $S_4$, and the depth of the denuded zone (DZ) after step $S_4$ as measured from the surface of the wafer are reported in Table II. FIGS. 6, 7, and 8 show cross-sections of the resulting wafers (these figures are enlargements of photographs taken at a magnification of 200×); sample 3–4 is shown in FIG. 6, sample 3–5 is shown in FIG. 7, and sample 3–6 is shown in FIG. 8.

TABLE II

| Sample | 3–4 | 3–5 | 3–6 |
|---|---|---|---|
| $S_1$ | 15 min at 1,000° C. in $N_2$ + ~1% $O_2$ | 15 min at 1,000° C. in $N_2$ + ~1% $O_2$ | 15 min at 1,000° C. in $N_2$ + ~1% $O_2$ |

TABLE II-continued

| Sample | 3–4 | 3–5 | 3–6 |
|---|---|---|---|
| $S_2$ | 35 seconds at 1250° C. in $N_2$ | 35 seconds at 1250° C. in $N_2$ | 35 seconds at 1250° C. in $N_2$ |
| $S_3$ | 125° C./sec 4 hr at | 125° C./sec 4 hr at | 125° C./sec 4 hr at |
| $S_4$ | 800° C. + 16 hr at 1,000° C. in $N_2$ | 800° C. + 16 hr at 1,000° C. in $N_2$ | 800° C. + 16 hr at 1,000° C. in $N_2$ |
| $O_i$ (atoms/cm$^3$) | $6 \times 10^{17}$ | $7 \times 10^{17}$ | $8 \times 10^{17}$ |
| OPD (atoms/cm$^3$) | $4 \times 10^{10}$ | $1 \times 10^{10}$ | $6 \times 10^{10}$ |
| DZ (depth in $\mu$m) | ~40 | ~40 | ~40 |

Figure 9:
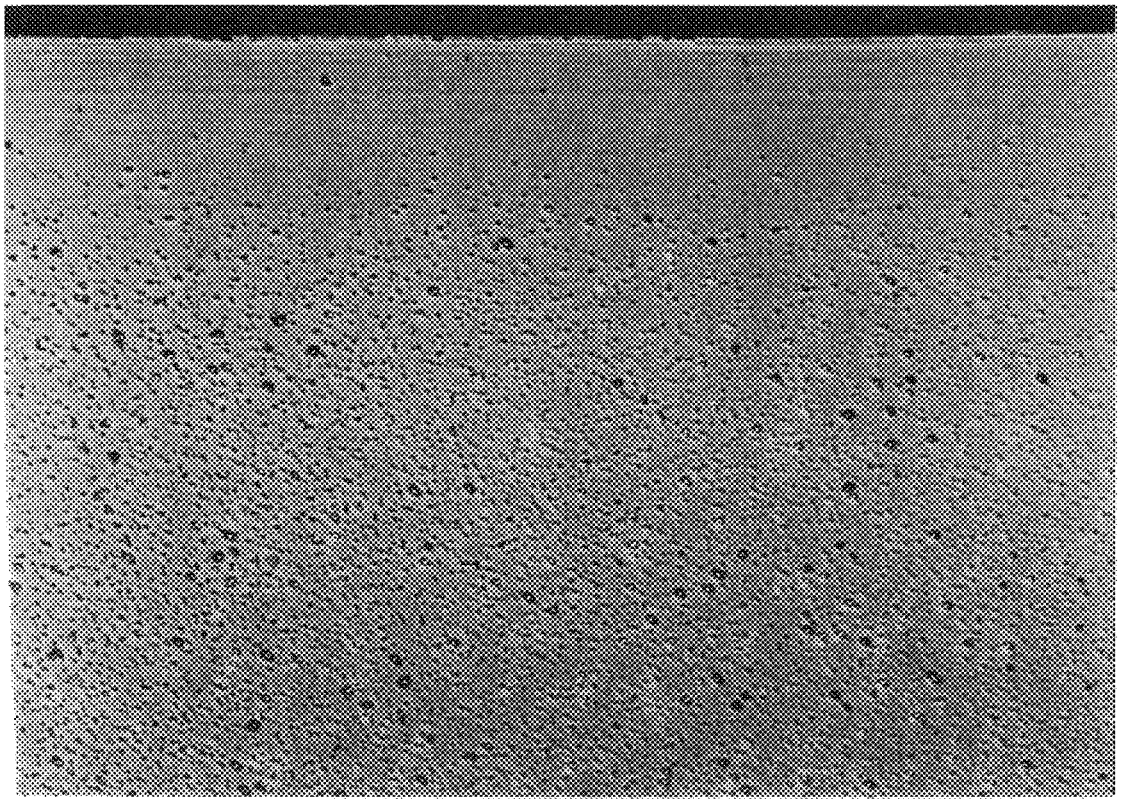
FIG. 9 is a photograph of a cross-section of a wafer (sample 1–8) which was subjected to the series of steps set forth in Example 3.
Figure 10:
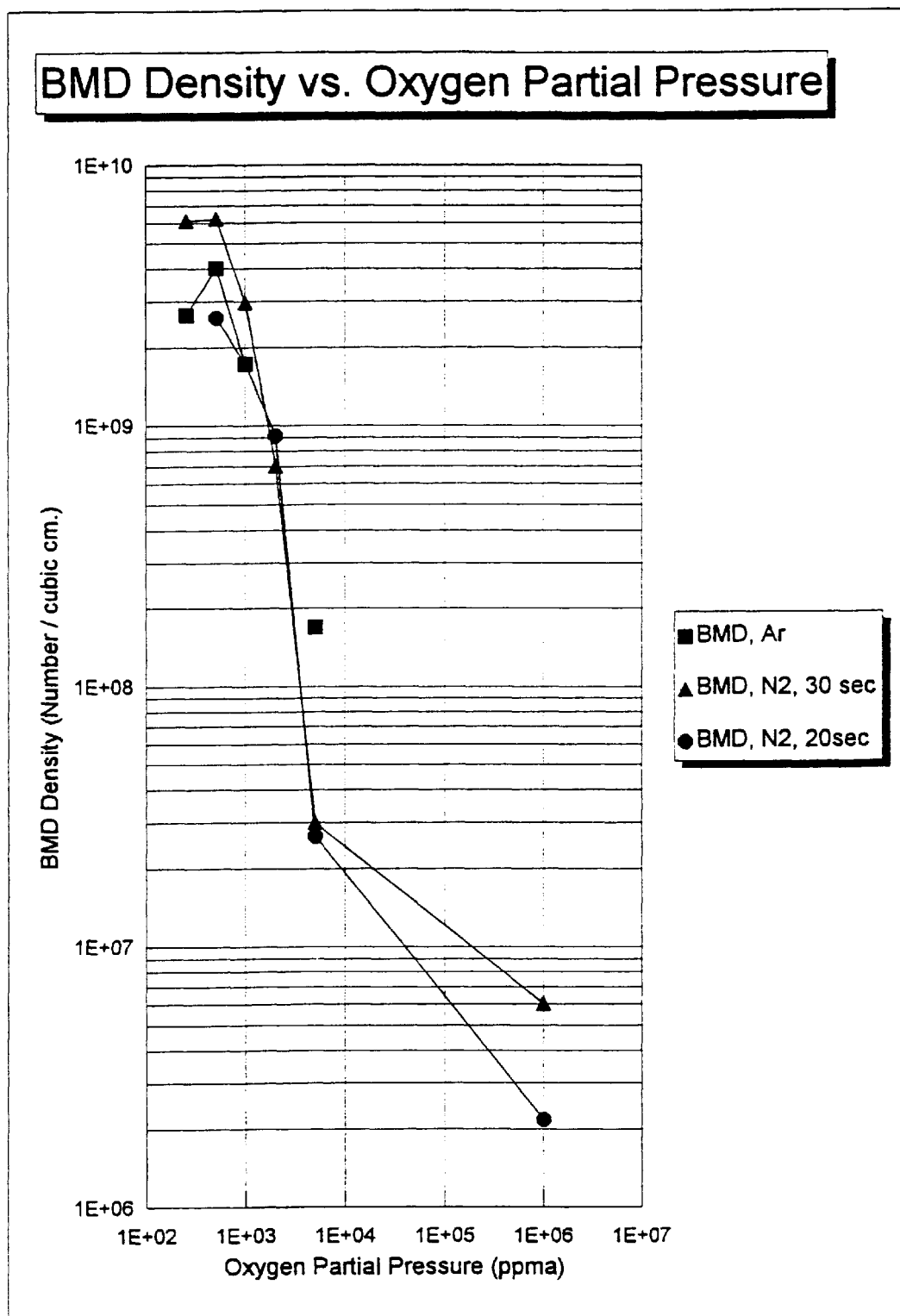
FIG. 10 is logarithmic graph of the number density of bulk microdefects (BMD) versus the partial pressure of oxygen present in the atmosphere during rapid thermal annealing of single crystal silicon wafers in accordance with the present invention, as described in Example 4.

To demonstrate that the process of the present invention was relatively independent of the conditions used for the oxygen precipitate stabilization and growth step ($S_4$), a wafer (sample 1–8) having the same initial oxygen concentration was subjected to the same series of steps described in Example 2 for sample 3–4 except that a proprietary, commercial 16 Mb DRAM process was used as the oxygen precipitate stabilization and growth step ($S_4$). FIG. 9 shows a cross-section of the resulting wafer (this figure is an enlargement of a photograph taken at a magnification of 200×). After step $S_4$, samples 1–8 and 3–4 had comparable bulk oxygen precipitate densities ($7\times10^{10}$/cm$^3$ for sample 1–8 versus $4\times10^{10}$/cm$^3$ for sample 3–4) and comparable denuded zone depths (approximately 40 micrometers).

EXAMPLE 4

This example illustrates the trend that may be observed in the density of bulk microdefects (BMD), i.e., the density of oxygen precipitants, and the depth of the denuded zone (DZ) resulting from an increase in the concentration of oxygen in the atmosphere during the heat-treatment. Three different sets of wafers were subjected to rapid thermal annealing under varying process conditions. The wafers in Set A were annealed at 1200° C. for 30 seconds under a nitrogen atmosphere; the wafers in Set B were annealed under the same conditions for 20 seconds; and, the wafers in Set C were annealed at 1200° C. for 30 seconds under an argon atmosphere. A pre-oxidation step was not performed on any of the wafers in the three sets in this Example.

As indicated by Table III, below, the oxygen partial pressure was increased for each wafer within a given Set. Once annealing was completed, the BMD density and DZ depth for each wafer was determined by means standard in the art. The results are present in Table III, below.

TABLE III

| Wafer Set | Oxygen Partial Pressure | BMD Density (defects/cm$^{-3}$) | DZ Depth (microns) |
|---|---|---|---|
| A | 250 ppma | $6.14 \times 10^9$ | 70 |
| A | 500 ppma | $6.24 \times 10^9$ | 80 |
| A | 1000 ppma | $2.97 \times 10^9$ | 80 |
| A | 2000 ppma | $7.02 \times 10^8$ | 100 |
| A | 5000 ppma | $2.99 \times 10^7$ | ND |
| A | $1 \times 10^6$ ppma | $6.03 \times 10^6$ | ND |
| B | 500 ppma | $2.59 \times 10^9$ | 80 |
| B | 1000 ppma | $1.72 \times 10^9$ | 100 |
| B | 2000 ppma | $9.15 \times 10^8$ | 100 |
| B | 5000 ppma | $2.65 \times 10^7$ | ND |
| B | $1 \times 10^6$ ppma | $2.17 \times 10^6$ | ND |
| C | 250 ppma | $2.65 \times 10^9$ | 90 |
| C | 500 ppma | $4.03 \times 10^9$ | 70 |
| C | 1000 ppma | $1.72 \times 10^9$ | 140 |
| C | 5000 ppma | $1.69 \times 10^8$ | 120 |

ND = not determined

The above data shows that as the partial pressure of oxygen in the atmosphere increases, the number density of bulk microdefects decreases. In addition, when the oxygen partial pressure reaches 10,000 ppma, the number density of bulk microdefects is indistinguishable from the number density of bulk microdefects which is observed in wafers which have been subjected to an oxygen precipitation heat-treatment without a prior rapid thermal annealing in accordance with the present invention.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

We claim:

1. A single crystal silicon wafer having two major, generally parallel surfaces, one of which is the front surface of the wafer and the other of which is the back surface of the wafer, a central plane between the front and back surfaces, a circumferential edge joining the front and back surfaces, a surface layer which comprises a first region of the wafer between the front surface and a distance, $D_1$, of at least about 10 micrometers as measured from the front surface and toward the central plane, and a bulk layer which comprises a second region of the wafer between the central plane and the first region, the wafer being characterized in that the wafer has a non-uniform distribution of crystal lattice vacancies with the concentration of vacancies in the bulk layer being greater than the concentration of vacancies in the surface layer with the vacancies having a concentration profile in which the peak density of the vacancies is at or near the central plane with the concentration generally decreasing from the position of peak density in the direction of the front surface of the wafer, and the wafer contains interstitial oxygen with the concentration of interstitial oxygen being substantially uniform between the center of the wafer and regions of the wafer which are within about 15 micrometers of the front surface.

2. The wafer of claim 1 wherein $D_1$ is at least about 20 micrometers.

3. The wafer of claim 1 wherein $D_1$ is at least about 50 micrometers.

4. The wafer of claim 1 wherein $D_1$ is between about 30 and about 100 micrometers.

5. The wafer of claim 1 wherein the concentration of interstitial oxygen at distances greater than 10 microns from the wafer surface is at least about 80% of the concentration of interstitial oxygen in the bulk layer.

6. The wafer of claim 5 wherein $D_1$ is at least about 20 micrometers.

7. The wafer of claim 5 wherein $D_1$ is at least about 50 micrometers.

8. The wafer of claim 5 wherein $D_1$ is between about 30 and about 100 micrometers.

9. The wafer of claim 1 wherein the concentration of interstitial oxygen at distances greater than 15 microns from the wafer surface is at least about 90% of the concentration of interstitial oxygen in the bulk layer.

10. The wafer as set forth in claim 1 wherein the wafer further comprises an epitaxial layer on the wafer surface.

11. The wafer of claim 1 having a carbon concentration which is less than about $5 \times 10^{16}$ atoms/cm$^3$.

12. The wafer of claim 1 having a carbon concentration which is less than about $1 \times 10^{16}$ atoms/cm$^3$.

13. The wafer of claim 1 having a carbon concentration which is less than about $5 \times 10^{15}$ atoms/cm$^3$.

14. The wafer of claim 1 wherein the front surface is polished.

15. The wafer of claim 1 wherein the wafer has an absence of oxygen precipitate nucleation centers which are incapable of being dissolved by heat-treating the wafer at a temperature not in excess of 1300° C.

16. The wafer of claim 1 wherein the wafer has a substantially uniform oxygen concentration between the center of the wafer and regions of the wafer which are within about 10 micrometers of the front surface.

17. The wafer of claim 16 having a carbon concentration which is less than about $5 \times 10^{16}$ atoms/cm$^3$.

18. The wafer of claim 16 having a carbon concentration which is less than about $1 \times 10^{16}$ atoms/cm$^3$.

19. The wafer of claim 16 having a carbon concentration which is less than about $5 \times 10^{15}$ atoms/cm$^3$.

20. The wafer of claim 16 wherein the front surface is polished.

21. The wafer of claim 16 wherein the wafer has an absence of oxygen precipitate nucleation centers which are incapable of being dissolved by heat-treating the wafer at a temperature not in excess of 1300° C.

22. The wafer of claim 1 wherein the wafer has a substantially uniform oxygen concentration between the center of the wafer and regions of the wafer which are within about 10 micrometers of the front surface.

23. The wafer of claim 22 having a carbon concentration which is less than about $5 \times 10^{16}$ atoms/cm$^3$.

24. The wafer of claim 22 having a carbon concentration which is less than about $1 \times 10^{16}$ atoms/cm$^3$.

25. The wafer of claim 22 having a carbon concentration which is less than about $5 \times 10^{15}$ atoms/cm$^3$.

26. The wafer of claim 22 wherein the front surface is polished.

27. The wafer of claim 22 wherein the wafer has an absence of oxygen precipitate nucleation centers which are incapable of being dissolved by heat-treating the wafer at a temperature not in excess of 1300° C.

28. The wafer of claim 1 wherein the wafer has a substantially uniform oxygen concentration between the center of the wafer and regions of the wafer which are within about 5 micrometers of the front surface.

29. The wafer of claim 28 having a carbon concentration which is less than about $5 \times 10^{16}$ atoms/cm$^3$.

30. The wafer of claim 28 having a carbon concentration which is less than about $1 \times 10^{16}$ atoms/cm$^3$.

31. The wafer of claim 28 having a carbon concentration which is less than about $5 \times 10^{15}$ atoms/cm$^3$.

32. The wafer of claim 28 wherein the front surface is polished.

33. The wafer of claim 28 wherein the wafer has an absence of oxygen precipitate nucleation centers which are incapable of being dissolved by heat-treating the wafer at a temperature not in excess of 1300° C.

34. The wafer of claim 1 wherein the wafer has a substantially uniform oxygen concentration between the center of the wafer and regions of the wafer which are within about 3 micrometers of the front surface.

35. The wafer of claim 34 having a carbon concentration which is less than about $5 \times 10^{16}$ atoms/cm$^3$.

36. The wafer of claim 34 having a carbon concentration which is less than about $1 \times 10^{16}$ atoms/cm$^3$.

37. The wafer of claim 34 having a carbon concentration which is less than about $5 \times 10^{15}$ atoms/cm$^3$.

38. The wafer of claim 34 wherein the front surface is polished.

39. The wafer of claim 34 wherein the wafer has an absence of oxygen precipitate nucleation centers which are incapable of being dissolved by heat-treating the wafer at a temperature not in excess of 1300° C.

40. The wafer of claim 9 wherein $D_1$ is at least about 20 micrometers.

41. The wafer of claim 9 wherein $D_1$ is at least about 50 micrometers.

42. The wafer of claim 9 wherein $D_1$ is between about 30 and about 100 micrometers.

43. A single crystal silicon wafer having two major, generally parallel surfaces, one of which is the front surface of the wafer and the other of which is the back surface of the wafer, a central plane between the front and back surfaces, a circumferential edge joining the front and back surfaces, a denuded zone which comprises a region of the wafer from the front surface to a distance, $D_1$, of at least about 10 micrometers as measured in the direction of the central plane and which contains interstitial oxygen, and a bulk layer which comprises a second region of the wafer between the central plane and the first region and which contains oxygen precipitates, the wafer being characterized in that the concentration of interstitial oxygen in the denuded zone at a distance equal to one-half of $D_1$ is at least about 75% of the maximum concentration of interstitial oxygen in the denuded zone.

44. The wafer of claim 43 wherein $D_1$ is at least 20 micrometers.

45. The wafer of claim 44 wherein the concentration of interstitial oxygen in the denuded zone at a distance equal to one-half of $D_1$ is at least about 80% of the maximum concentration of interstitial oxygen in the denuded zone.

46. The wafer of claim 43 wherein the concentration of interstitial oxygen in the denuded zone at a distance equal to one-half of $D_1$ is at least about 90% of the maximum concentration of interstitial oxygen in the denuded zone.

47. The wafer of claim 43 wherein $D_1$ is at least 50 micrometers.

48. The wafer of claim 47 wherein the concentration of interstitial oxygen in the denuded zone at a distance equal to one-half of $D_1$ is at least about 85% of the maximum concentration of interstitial oxygen in the denuded zone.

49. The wafer of claim 47 wherein the concentration of interstitial oxygen in the denuded zone at a distance equal to one-half of $D_1$ is at least about 95% of the maximum concentration of interstitial oxygen in the denuded zone.

50. The wafer of claim 43 wherein $D_1$ is between 30 and 100 micrometers.

51. The wafer of claim 50 wherein the concentration of interstitial oxygen in the denuded zone at a distance equal to one-half of $D_1$ is at least about 85% of the maximum concentration of interstitial oxygen in the denuded zone.

52. The wafer of claim 43 wherein the wafer further comprises an epitaxial layer on the wafer surface.

53. The wafer of claim 43 having a carbon concentration which is less than about $5 \times 10^{16}$ atoms/cm$^3$.

54. The wafer of claim 43 having a carbon concentration which is less than about $1\times10^{16}$ atoms/cm$^3$.

55. The wafer of claim 43 having a carbon concentration which is less than about $5\times10^{15}$ atoms/cm$^3$.

56. The wafer of claim 43 wherein the front surface is polished.

57. The wafer of claim 43 wherein the wafer has an absence of oxygen precipitate nucleation centers which are incapable of being dissolved by heat-treating the wafer at a temperature not in excess of 1300° C.

* * * * *

UNITED STATES PATENT AND TRADEMARK OFFICE
CERTIFICATE OF CORRECTION

PATENT NO.   : 6,180,220 B1
DATED        : January 30, 2001
INVENTOR(S)  : Robert Falster, Marco Cornara, Daniela Gambaro and Massimiliano Olmo It is certified that error appears in the above-identified patent and that said Letters Patent is hereby corrected as shown below:

<u>Column 16,</u>
Line 44, please change "43" to read -- 44 --.

Signed and Sealed this

Sixteenth Day of July, 2002

Attest:

JAMES E. ROGAN
Director of the United States Patent and Trademark Office

Attesting Officer